(12) United States Patent
Gupta et al.

(10) Patent No.: US 6,963,081 B2
(45) Date of Patent: Nov. 8, 2005

(54) INTERFACIAL TRAP LAYER TO IMPROVE CARRIER INJECTION

(75) Inventors: Rahul Gupta, Santa Clara, CA (US); Florian Pschenitzka, San Jose, CA (US); Vi-En Choong, San Jose, CA (US); Pierre-Marc Allemand, San Jose, CA (US)

(73) Assignee: Osram Otpo Semiconductors GmbH, Regensburg (DE)

( * ) Notice: Subject to any disclaimer, the term of this patent is extended or adjusted under 35 U.S.C. 154(b) by 0 days.

(21) Appl. No.: 10/676,969

(22) Filed: Sep. 30, 2003

(65) Prior Publication Data

US 2005/0067638 A1 Mar. 31, 2005

(51) Int. Cl.[7] .................. H01L 35/24; H01L 51/00; H01L 29/24; H01L 29/167; H01L 29/207
(52) U.S. Cl. .................. 257/40; 257/102; 257/103; 257/607
(58) Field of Search .................. 257/40, 102, 103, 257/607

(56) References Cited

U.S. PATENT DOCUMENTS

| | | | |
|---|---|---|---|
| 6,274,979 B1 | 8/2001 | Celii et al. | |
| 6,580,213 B2 | 6/2003 | Yamazaki | |
| 6,586,764 B2 | 7/2003 | Buechel et al. | |
| 2004/0076853 A1 | * 4/2004 | Jerikov | 428/690 |
| 2004/0151887 A1 | * 8/2004 | Forrest et al. | 428/212 |

OTHER PUBLICATIONS

S.M. Sze, "Physics of Semiconductor Devices", 2nd Edition, 1981, pp. 270–273 and 516–531.
"Voltage Reduction in Organic Light–Emitting Diodes", L.S. Hung, M.G. Mason, Applied Physics Letters, vol. 78, No. 23, Jun. 2, 2001, pp. 3732–3734.
"Enhanced Hole Injection in a Bilayer Vacuum–Deposited Organic Light–Emitting Device Using a P–Type Doped Silicon Anode", X. Zhou, J. He, L. S. Liao, M. Lu, Z. H. Xiong, X.M. Ding, X. Y. Hou, F.G. Tao, C.E. Zhou and S.T. Lee, Applied Physics Letters, vol. 74, No. 4, Jan. 25, 1999, pp. 609–611.

* cited by examiner

*Primary Examiner*—Ngân V. Ngô
(74) *Attorney, Agent, or Firm*—Thomas George

(57) ABSTRACT

In an embodiment of the invention, an electronic device includes an interfacial layer with traps. This interfacial layer is between an electrode and an organic layer, and if the electrode was adjacent to the organic layer, the energy barrier between these two layers is such that the current through the organic layer is limited by charge injection into this layer rather than the transport properties of the organic layer. The traps are used to accumulate charges of one charge type (e.g., either electrons or holes) within the interfacial layer. By accumulating charges, the bands of the interfacial layer are bent so that charges can tunnel from the electrode to the organic layer thus increasing the efficiency of the electronic device and allowing organic layers to be used within an electronic device that otherwise would be too inefficient for use in that device.

20 Claims, 8 Drawing Sheets

INTERFACIAL TRAP LAYER TO IMPROVE CARRIER INJECTION

BACKGROUND OF THE INVENTION

An organic light emitting diode ("OLED") display can include, for example, the following: (1) an anode on a substrate; (2) an emissive layer on the anode; and (3) a cathode on the emissive layer. When the display is forward biased, holes are injected from the anode into the emissive layer, and the electrons are injected from the cathode into the emissive layer. Both carriers recombine with each other, the location of which is called the recombination zone; the recombinations in the emissive layer produce visible light. The power efficiency of the device is controlled by many factors, two of which are (1) the radiative recombination efficiency, and (2) the operating voltage. Radiative recombination efficiency is the ratio of the number of electrons and holes that result in the emission of a photon per unit time to the ratio of the total current (number of holes and electrons flowing through the film per unit time). In order to inject the electrons and holes into the device a voltage has to be applied. In order to get an efficient device, the voltage required to inject a given current must be minimized. Usually a higher voltage a results in higher current. By balancing the number of electrons and holes injected into the emissive layer, the number of recombinations per unit current in the emissive layer can be increased thus improving the radiative recombination efficiency of the display. By increasing the current (the number of charges injected per unit time) at a given voltage, the power efficiency of the device can be improved.

However, if the energy barrier between the anode and the emissive layer is large enough to substantially inhibit hole injection into the emissive layer, or the energy barrier between the cathode and the emissive layer is large enough to substantially inhibit electron injection into the emissive layer, then there will be a large imbalance in the number of electrons and holes and this will lead to very few if any recombinations in the emissive layer resulting in very low display efficiency making unusable this combination of electrodes and the emissive layer.

The injection of charge carriers into the emissive layer is usually optimized by matching the Fermi level of the electrodes (e.g., the charge injection layer of the cathode) to the energy level of the emissive layer into which the charges are to be injected (the highest occupied molecular orbital ("HOMO") level for holes and the lowest unoccupied molecular orbital ("LUMO") level for electrons). The energy difference between the Fermi level of the electrode and the emissive layer is referred to as the injection barrier. The voltage required to inject current increases exponentially with the injection barrier. By requiring that the energy levels match, the choice of electrodes that can be used with a certain emissive layer is limited. Each emissive layer may have optimal electrodes that may or may not be manufacturable. This is a major factor in full color or area color displays where different emissive layers are used to produce light in each of the different desired colors. For ease of manufacturing, the same electrodes (common electrodes) are used for all the emissive layers used in the display, but only some of the multiple emissive layers operate optimally with these electrodes. Also, some emissive layers have a very large ionization potential that substantially inhibits hole injection from the commonly used stable anodes such as Indium Tin Oxide (ITO) into the HOMO of the emissive layer thus preventing their use in OLED displays. The above-mentioned difficulty in injecting holes is more commonly observed in wide band gap emissive layers, for example the blue emitting materials. There also exist emissive polymers that have very low electron affinity. In order to efficiently inject electrons into these, we would need to use very low work function metals, but these metals are highly reactive and thus very unstable. It would be desirable to use these emissive layers within an OLED display since they have desirable characteristics such as the preferred emission color, good efficiency, good transport properties, or long lifetime.

Therefore, there is a need to efficiently use different emissive layers with the same electrodes, and efficiently use wide band-gap emissive layers with readily available and/or easily manufacturable electrodes.

SUMMARY

An embodiment of an electronic device is described. The electronic device includes a substrate, an anode on the substrate, an organic layer on the anode, and a cathode on the organic layer, and (1) a first interfacial layer is between the anode and the organic layer and/or (2) a second interfacial layer is between the organic layer and the cathode. The first interfacial layer includes hole traps that accumulate a portion of the holes so that at least some of the holes can tunnel from the anode through the first interfacial layer to the organic layer, and the second interfacial layer includes electron traps that accumulate a portion of the electrons so that at least some of the electrons can tunnel from the cathode through the second interfacial layer to the organic layer.

DETAILED DESCRIPTION

In an embodiment of the invention, an electronic device includes an interfacial layer with traps. This interfacial layer is between an electrode and an organic layer, and if the electrode was adjacent to the organic layer, the energy barrier between these two layers is such that the current through the organic layer is limited by charge injection into this layer rather than the transport properties of the organic layer. The traps are used to accumulate charges of one charge type (e.g., either electrons or holes) within the interfacial layer. By accumulating charges, the bands of the interfacial layer are bent so that charges can tunnel from the electrode to the organic layer thus increasing the efficiency of the electronic device and allowing organic layers to be used within an electronic device that otherwise would be too inefficient for use in that device.

Figure 1:
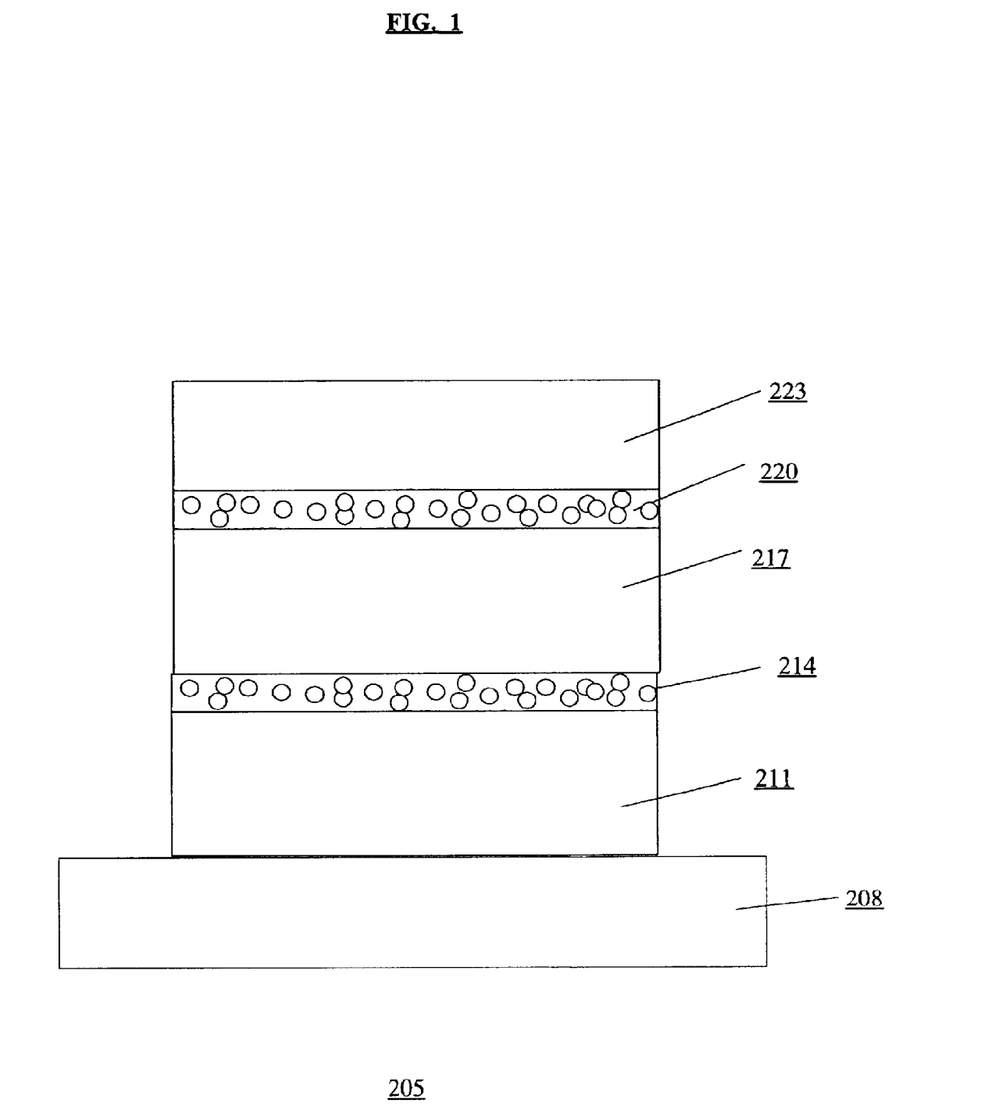
FIG. 1 shows a cross-sectional view of an embodiment of an electronic device 205 according to the present invention.

FIG. 1 shows a cross-sectional view of an embodiment of an electronic device 205 according to the present invention. The electronic device 205 can be any device that injects charges into an active organic layer. Examples of electronic devices are an OLED pixel within an OLED display, an OLED element within an OLED light source used for general purpose lighting, and a phototransistor. In FIG. 1, a first electrode 211 is on a substrate 208. As used within the specification and the claims, the term "on" includes when there is direct physical contact between the two parts and when there is indirect contact between the two parts because they are separated by one or more intervening parts. An optional interfacial layer 214 is on the first electrode 211. The interfacial layer 214 is an intermixed layer where one of the layer components traps holes or electrons (the traps are designated by the circles within the interfacial layer 214). For example, the trapping component can be a dopant in the case that the layer is formed by spin-coating a polymer solution, or the trapping component can be another small molecule material if different materials are co-evaporated to form the layer. If the first electrode 211 is an anode, then the interfacial layer 214 includes hole traps that trap holes in order to bend the bands of the interfacial layer 214. If, however, the first electrode 211 is a cathode, then the interfacial layer 214 includes electron traps that trap electrons in order to bend the bands of the interfacial layer 214.

An organic layer 217 is on the optional interfacial layer 214 if present, otherwise, the organic layer 217 is on the first electrode 211. For example, in the case of OLEDs, the organic layer 217 is an emissive layer that emits light resulting from the recombination of electrons and holes in this layer. The organic emissive layer can be comprised of, for example, polymers or small molecules. An optional interfacial layer 220 is on the organic layer 217. The interfacial layer 220 is an intermixed layer where one of the components has energy levels that trap holes or electrons (the traps are designated by the circles within the interfacial layer 220). If a second electrode 223 is an anode, then the interfacial layer 220 traps holes. If, however, the second electrode 223 is a cathode, then the interfacial layer 220 traps electrons. In one configuration of the embodiment of the electronic device 205, only the interfacial layer 214 is present. Alternatively, in another configuration, only the interfacial layer 220 is present. In yet another configuration, both the interfacial layer 214 and the interfacial layer 220 are present in the electronic device 205.

The second electrode 223 is on the interfacial layer 220 if present, otherwise, the second electrode is on the organic layer 217. These layers are described in greater detail below.

Substrate 208:

The substrate 208 can be any material, which can support the layers on it. The substrate 208 can be transparent or opaque (e.g., the opaque substrate is used in top-emitting devices). By modifying or filtering the wavelength of light which can pass through the substrate 208, the color of light emitted by the device can be changed. The substrate 208 can be comprised of glass, quartz, silicon, plastic, or stainless steel; preferably, the substrate 208 is comprised of thin, flexible glass. The preferred thickness of the substrate 208 depends on the material used and on the application of the device. The substrate 208 can be in the form of a sheet or continuous film. The continuous film is used, for example, for roll-to-roll manufacturing processes which are particularly suited for plastic, metal, or metallized plastic foils.

First Electrode 211:

In one configuration of this embodiment, the first electrode 211 functions as an anode (the anode is a conductive layer which serves as a hole-injecting layer and which comprises a material with work function greater than about 4.5 eV). Typical anode materials include metals (such as platinum, gold, palladium, nickel, indium, and the like); metal oxides (such as tin oxide, indium tin oxide ("ITO"), and the like); graphite; doped inorganic semiconductors (such as silicon, germanium, gallium arsenide, and the like); or highly doped conducting polymers (such as polyaniline, polypyrrole, polythiophene, and the like).

In an alternative configuration, the first electrode 211 functions as a cathode (the cathode is a conductive layer which serves as an electron-injecting layer and which comprises a material with a low work function). The first electrode 211 can be a cathode, rather than an anode, if for example, the OLED device is top-emitting. Typical cathode materials are listed below in the section for the "second electrode 223".

The first electrode 211 can be transparent, semi-transparent, or opaque to the wavelength of light generated within the device. If the first electrode is an anode, then its thickness is from about 10 nm to about 1000 nm, preferably, from about 50 nm to about 200 nm, and more preferably, is about 100 nm.

The first electrode 211 can typically be fabricated using any of the techniques known in the art for deposition of thin films, including, for example, vacuum evaporation, sputtering, electron beam deposition, or chemical vapor deposition.

Interfacial Layers 214, 220:

In a first configuration of the embodiment of the electronic device, only the interfacial layer 214 is present. Alternatively, in a second configuration, only the interfacial layer 220 is present. In a third configuration, both the interfacial layer 214 and the interfacial layer 220 are present.

The interfacial layers 214, 220 include hole traps or electron traps and the accumulation of charges in these traps results in a large electric field across these layers. The large electric field across these layers causes increased band bending and this allows at least some of the charges to tunnel from the electrode(s) to the organic layer 217 thus increasing the number of charges injected into the organic layer 217. Because the interfacial layer provides a step in energy level, by adding the interfacial layer, there may also be a greater number of charges that are thermonically injected into the organic layer 217. By balancing the number of electrons and holes injected into the emissive layer, the radiative recombination efficiency of the display can be improved. By increasing the current (the number of charges injected per unit time) at a given voltage, the power efficiency of the device can be improved.

Each of the interfacial layers 214, 220 is an intermixed layer that is comprised of two or more components (e.g., the components can be different polymers, different small molecule materials, or a combination of small molecules and polymers in which one of the components is a small molecule and the other component is a polymer) in which one of the components acts as traps; the traps are either electron traps or hole traps. The trapping component can be added, for example, as a dopant in the case that the interfacial layer is formed by spin-coating a polymer solution, or the trapping component can be added by, for example, evaporating the trapping component where different small molecule materials are co-evaporated to form the interfacial layer.

If the first electrode 211 is an anode, then the interfacial layer 214 includes hole traps. Alternatively, if the second electrode 223 is an anode, then the interfacial layer 220 includes hole traps. In either of these cases, in order to trap holes, the trapping component within the interfacial layer has a HOMO level that is higher than the HOMO level of the other components. Here, the difference between the HOMO level of the trapping component and the HOMO level of the other components (i.e., this difference is referred to as the energy barrier to trap holes ("$\varnothing_{bh}$")) is much greater than the thermal energy ("kT")(e.g., kT=0.0259 eV at T=300K). The $\varnothing_{bh}$ is large enough to trap holes in order to bend the bands of the interfacial layer. In the case that the interfacial layer includes hole traps, the hole trap density within the interfacial layers 214, 220 is greater than $10^{14}/cm^3$ and preferably, is greater than $10^{16}/cm^3$. A higher hole trap density results in a greater electric field across the interfacial layer for the same voltage.

If the first electrode 211 is a cathode, then the interfacial layer 214 includes electron traps. Alternatively, if the second electrode 223 is a cathode, then the interfacial layer 220 includes electron traps. In either of these cases, in order to trap electrons, the trapping component within the interfacial layer has a LUMO level that is lower than the LUMO level of the other components. Here, the difference between the LUMO level of the trapping component and the LUMO level of the other components (i.e., the energy barrier to trap electrons ("$\varnothing_{be}$")) is much greater than the thermal energy ("kT"). The $\varnothing_{be}$ is large enough to trap electrons in order to bend the bands of the interfacial layer. In the case that the interfacial layers include electron traps, the electron trap density within the interfacial layers 214, 220 is greater than $10^{14}/cm^3$ and preferably, is greater than $10^{16}/cm^3$.

The hole traps or electron traps within the interfacial layers 214, 220 can be those described in the co-pending patent application entitled "Controlling Relative Mobilities of Charge Carriers Using Traps" by Rahul Gupta, Florian Pschenitzka, Franky So, Pierre-Marc Allemand, and Vi-En Choong, filed concurrently on Sep. 30, 2003. This concurrently filed application is incorporated by reference herein in its entirety.

The HOMO level of one version of an interfacial layer that is adjacent to an anode is such that if the typical operating voltage is applied across the electrodes, holes can easily thermonically inject from the anode to the HOMO level of the host components of the interfacial layer and are subsequently trapped in the hole trap sites. Alternatively, in another version of the interfacial layer that is adjacent to the anode, the interfacial layer has a band lineup such that no holes can be thermonically injected into the host components of the interfacial layer if the typical operating voltage is applied, but the energy levels of the hole traps are lined up such that the holes are injected directly into the HOMO level of the hole traps.

Similarly, the LUMO level of one version of an interfacial layer that is adjacent to a cathode is such that if a small voltage is applied across the electrodes, electrons can easily thermonically inject from the cathode to the LUMO level of the host components of the interfacial layer and are subsequently trapped in the electron trap sites. Alternatively, in another version of the interfacial layer that is adjacent to the cathode, the interfacial layer has a band lineup such that no electrons can be thermonically injected into the host components of the interfacial layer if the typical operating voltage is applied, but the energy levels of the electron traps are lined up such that the electrons are injected directly into the LUMO level of the electron traps.

The interfacial layers 214, 220 are relatively thin layers so as to facilitate charge tunneling to the organic layer. For example, the interfacial layers 214, 220 can have a thickness of less than 40 nm, preferably, less than 10 nm, and more preferably between 1 and 5 nm.

The interfacial layer 214 and the interfacial layer 220 can be deposited using selective deposition techniques or nonselective deposition techniques. Examples of selective deposition techniques include, for example, ink jet printing, flex printing, and screen printing. Examples of nonselective deposition techniques include, for example, spin coating, dip coating, web coating, and spray coating.

Organic Layer 217:

In one embodiment of the electronic device 205, if the interfacial layer is adjacent to the anode, then the energy barrier between the anode and the organic layer 217 is such that only a very small number of holes can be thermonically injected from the anode to the organic layer 217. If the interfacial layer is adjacent to the cathode, then the energy barrier between the cathode and the organic layer 217 is such that only a very small number of electrons can be thermonically injected from the cathode to the organic layer 217.

In one configuration of the electronic device 205, the organic layer 217 is comprised of an organic electroluminescent material. The organic electroluminescent material can be comprised of organic polymers or organic small molecules. Preferably, the organic polymers are fully or partially conjugated polymers. For example, suitable organic polymer materials include one or more of the following in any combination: poly(p-phenylenevinylene) ("PPV"), poly(2-methoxy-5(2'-ethyl)hexyloxyphenylenevinylene) ("MEH-PPV"), one or more PPV-derivatives (e.g. di-alkoxy or di-alkyl derivatives), polyfluorenes and/or co-polymers incorporating polyfluorene segments, PPVs and related co-polymers, poly(2,7-(9,9-di-n-octylfluorene)-(1,4-phenylene-((4-secbutylphenyl)imino)-1,4-phenylene) ("TFB"), poly(2,7-(9,9-di-n-octylfluorene)-(1,4-phenylene-((4-methylphenyl)imino)-1,4-phenylene-((4-methylphenyl)imino)-1,4-phenylene)) ("PFM"), poly(2,7-(9,9-di-n-octylfluorene)-(1,4-phenylene-((4-methoxyphenyl)imino)-1,4-phenylene)) ("PFMO"), poly(2,7-(9,9-di-n-octylfluorene) ("F8"), (2,7-(9,9-di-n-octylfluorene)-3,6-Benzothiadiazole) ("F8BT"), or poly(9,9-dioctylfluorene).

The thickness of the organic layer 217 is from about 5 nm to about 500 nm, and preferably, from about 20 nm to about 100 nm.

The organic layer 217 can be deposited using selective deposition techniques or nonselective deposition techniques. Examples of selective deposition techniques include, for example, ink jet printing, flex printing, and screen printing. Examples of nonselective deposition techniques include, for example, spin coating, dip coating, web coating, and spray coating.

Second Electrode 223:

In one configuration of this embodiment, the second electrode 223 functions as a cathode (the cathode is a conductive layer which serves as an electron-injecting layer and which comprises a material with a low work function). While the cathode can be comprised of many different materials, preferable materials include aluminum, silver, magnesium, calcium, barium, or combinations thereof. More preferably, the cathode is comprised of aluminum, aluminum alloys, or combinations of magnesium and silver.

In an alternative configuration, the second electrode 223 functions as an anode (the anode is a conductive layer which serves as a hole-injecting layer and which comprises a material with work function greater than about 4.5 eV). The second electrode 223 can be an anode, rather than a cathode, if for example, the OLED device is top-emitting. Typical anode materials are listed earlier in the section for the "first electrode 211".

The second electrode 223 can be transparent, semi-transparent, or opaque to the wavelength of light generated within the device. If the second electrode 223 is a cathode, then its thickness is from about 10 nm to about 1000 nm, preferably from about 50 nm to about 500 nm, and more preferably, from about 100 nm to about 300 nm.

The second electrode 223 can be deposited using any of the techniques known in the art for deposition of thin films, including, for example, vacuum evaporation, sputtering, electron beam deposition, or chemical vapor deposition.

The interfacial layer with traps is placed between the anode and the organic layer when, for example, it is more difficult to inject holes than it is to inject electrons into an organic layer. The addition of the interfacial layer between the anode and the organic layer will improve the injection of holes into the organic layer as explained below. As used within the specification and the claims, the term "between" includes when there is direct physical contact between the three layers (e.g., the anode, the interfacial layer, and the organic layer) and when there is indirect contact between the three layers because there is one or more intervening layers between the anode and the interfacial layer and/or between the interfacial layer and the organic layer.

Figure 2A:
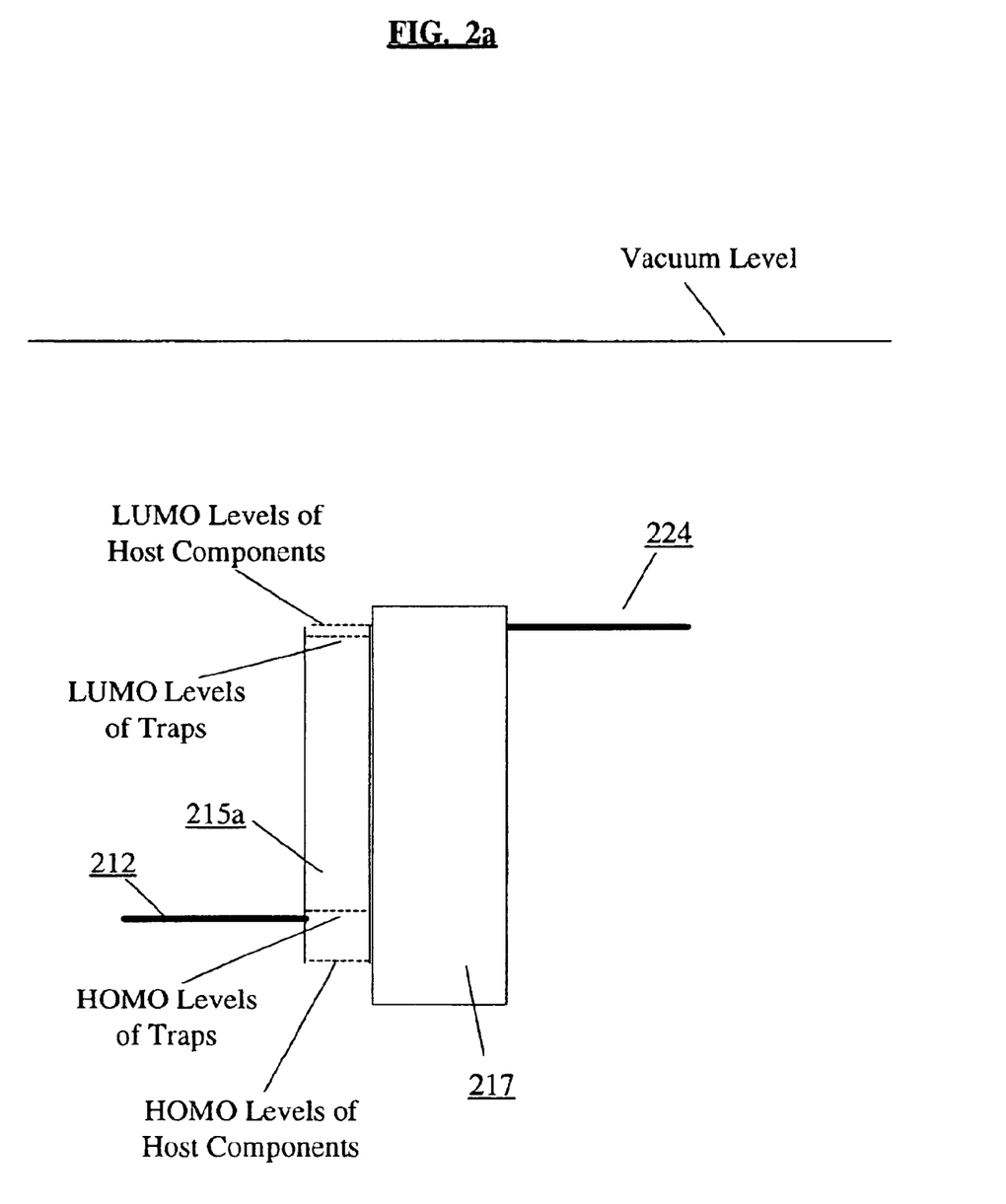
FIGS. 2a–d show energy band diagrams for different configurations of the embodiment of the electronic device according to the present invention.

FIG. 2a shows an energy band diagram of one version of a first configuration of the embodiment of the electronic device according to the present invention. As shown in FIG. 2a, in the first configuration, only one interfacial layer 215a is present and this interfacial layer is between an anode 212 and the organic layer 217. The interfacial layer 215a includes hole traps and host components of the interfacial layer 215a. In the first version of the interfacial layer 215a, the hole injection barrier ("$\Phi_{bh}$") between the anode 212 and the HOMO levels of the host components is small enough that when a typical operating voltage is applied (e.g., this voltage is less than 20V, preferably, less than 10V), holes easily thermonically inject from the anode 212 to the HOMO levels of the host components. For example, the $\Phi_{bh}$ between the anode 212 and the HOMO levels of the host components is less than 0.3 eV, preferably, less than 0.1 eV. The $\theta_{bh}$ between the HOMO levels of the host components and the HOMO levels of the hole traps is sufficiently greater than kT in order to trap holes so that band bending of the interfacial layer 215a occurs. The injected holes are subsequently trapped at the hole traps within the interfacial layer 215a resulting in the accumulation of trapped holes in this layer.

The energy barrier between the interfacial layer 215a and the organic layer 217 is large such that only a very small number of holes are thermonically injected from the interfacial layer 215a to the organic layer 217. The HOMO levels of the organic layer 217 is much lower than the Fermi level of the anode 212 such that if these two layers were adjacent to each other, the energy barrier between these two layers is such that the current through the organic layer is limited by charge injection into this layer rather than the transport properties of the organic layer. For example, a difference between the Fermi level of the anode and the HOMO levels of the organic layer 217 can be at least 0.3 eV.

Figure 2B:
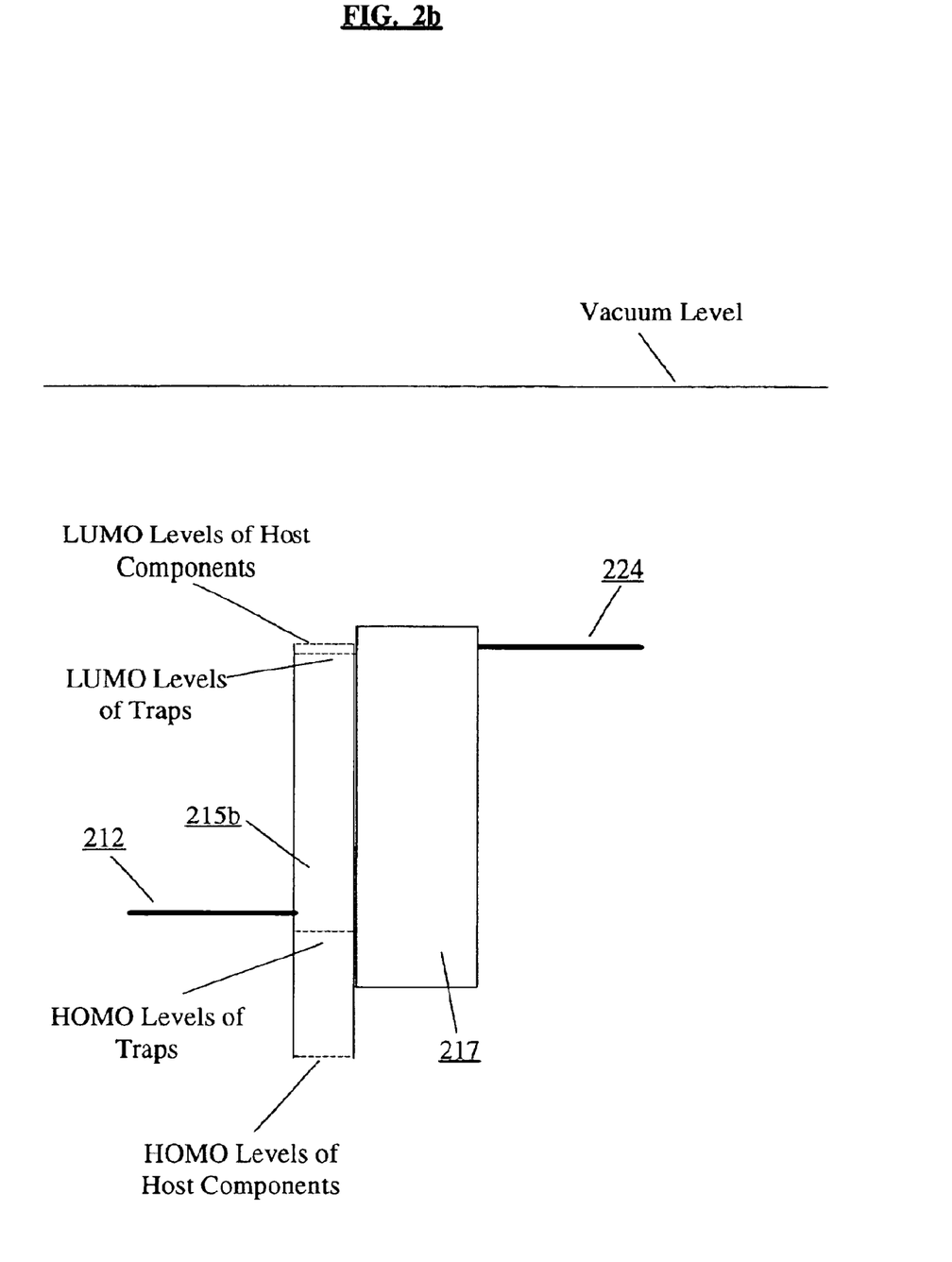

FIG. 2b shows an energy band diagram of another version of the first configuration of the embodiment of the electronic device according to the present invention. As shown in FIG. 2b, in the first configuration, only one interfacial layer is present and this interfacial layer 215b is between the anode 212 and the organic layer 217. The interfacial layer 215b includes hole traps and host components of the interfacial layer 215b. In the second version of the interfacial layer 215b, the hole injection barrier ("$\Phi_{bh}$") between the anode 212 and the HOMO levels of the host components is large enough to prevent thermionic injection of holes from the anode 212 to the HOMO levels of the host components when the typical operating voltage is applied. For example, the $\Phi_{bh}$ between the anode 212 and the HOMO levels of the host components is greater than 0.3 eV, preferably, greater than 0.5 eV. However, the ($\Phi_{bh}$ between the anode 212 and the HOMO levels of the traps is small enough that when said typical operating voltage is applied, holes can easily thermonically inject from the anode 212 directly to the HOMO levels of the hole traps. For example, the $\Phi_{bh}$ between the anode 212 and the HOMO levels of the traps is less than 0.3 eV, preferably, less than 0.1 eV.

The interfacial layer with traps is placed between the cathode and the organic layer when, for example, it is more difficult to inject electrons than it is to inject holes into an organic layer. The addition of the interfacial layer between the cathode and the organic layer will improve the injection of electrons into the organic layer as explained below.

Figure 2C:
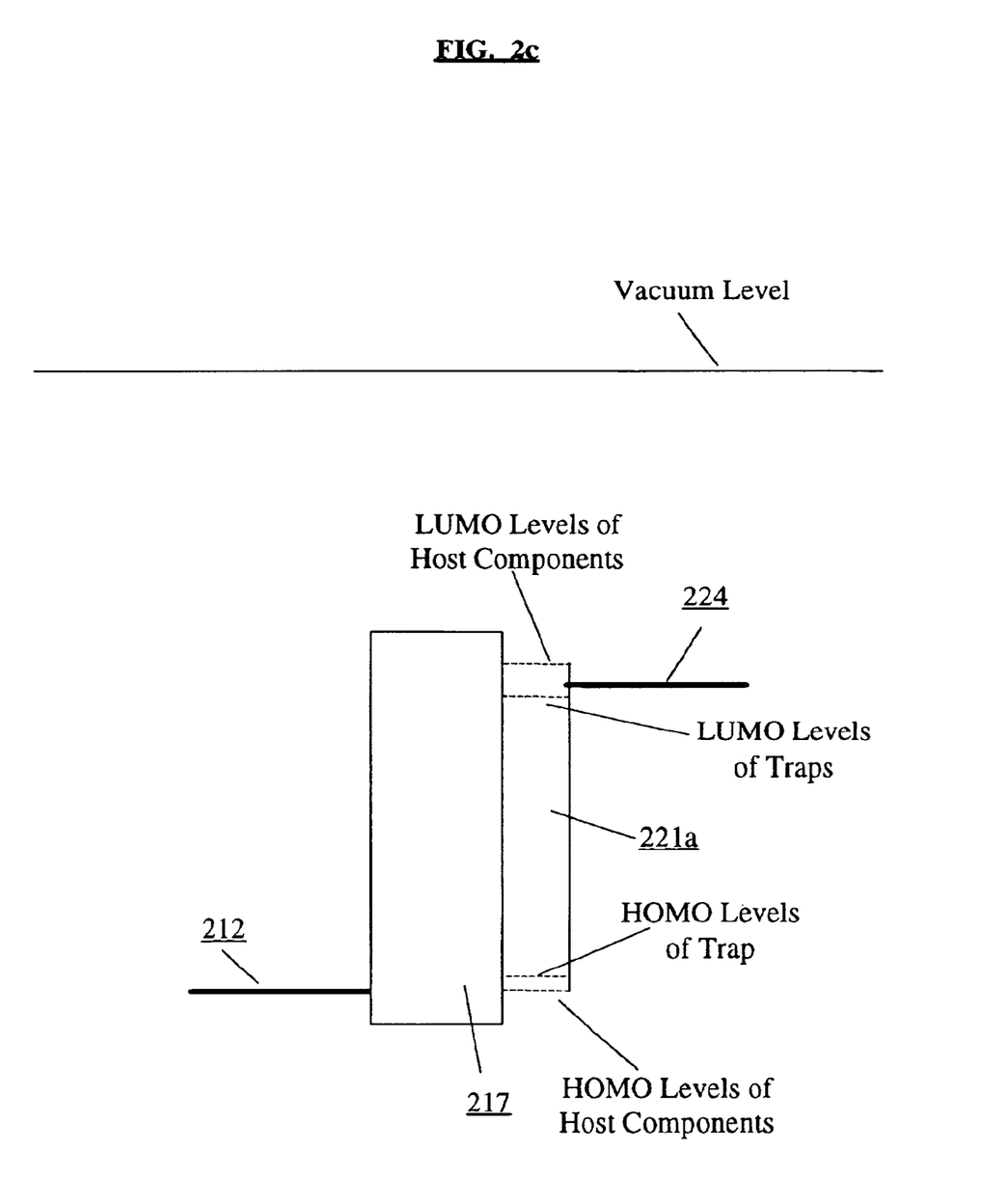

FIG. 2c shows an energy band diagram of one version of a second configuration of the embodiment of the electronic device according to the present invention. As shown in FIG. 2c, in the second configuration, only one interfacial layer 221a is present and this interfacial layer is between a cathode 224 and the organic layer 217. The interfacial layer 221a includes electron traps and host components of the interfacial layer 221a. In the first version of the interfacial layer 221a, the electron injection barrier ("$\Phi_{be}$") between the cathode 224 and the LUMO levels of the host components is small enough that when the typical operating voltage is applied, electrons can easily thermonically inject from the cathode 224 to the LUMO levels of the host components. For example, the $\Phi_{be}$ between the cathode 224 and the LUMO levels of the host components is less than 0.3 eV, preferably, less than 0.1 eV. The $\theta_{be}$ between the LUMO levels of the host components and the LUMO levels of the electron traps is sufficiently greater than kT in order to trap electrons so that band bending of the interfacial layer 221a occurs. The injected electrons are subsequently trapped at the electron traps within the interfacial layer 221a resulting in the accumulation of trapped electrons in this layer.

Figure 2D:
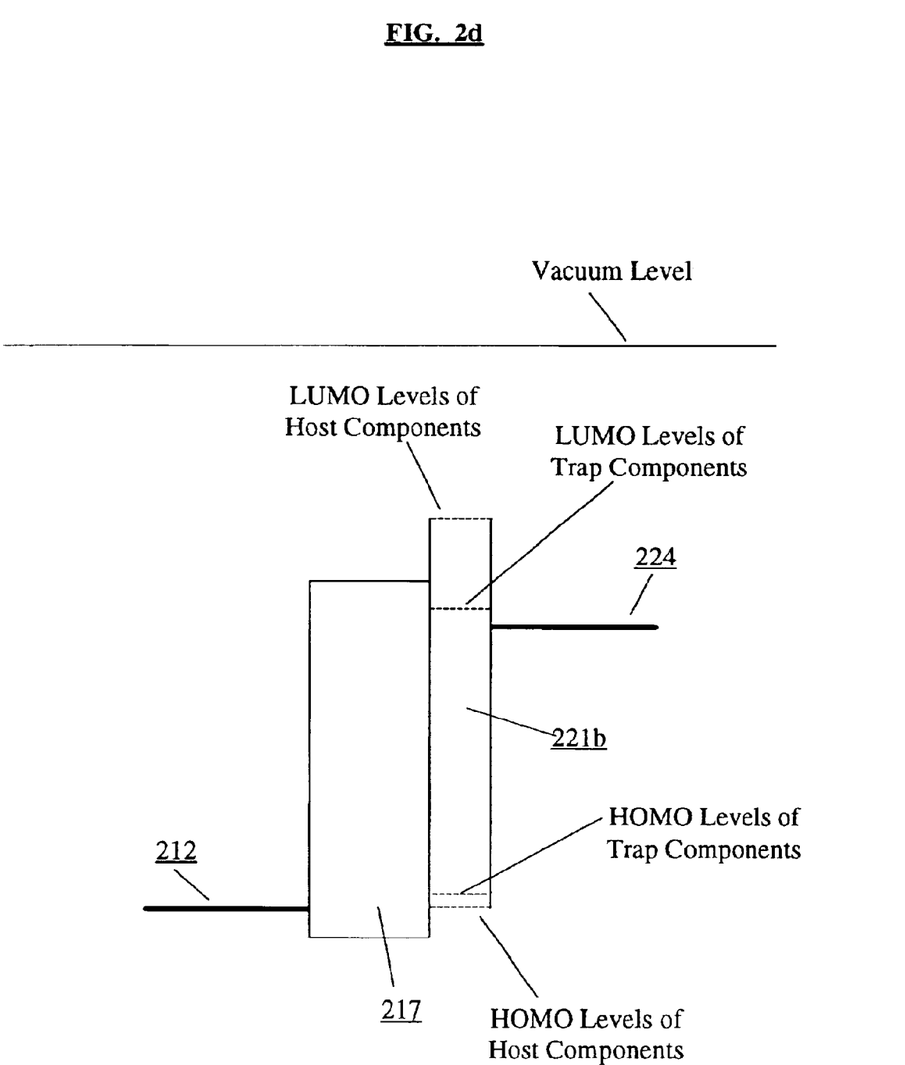

FIG. 2d shows an energy band diagram of another version of the second configuration of the embodiment of the electronic device according to the present invention. As shown in FIG. 2d, in the second configuration, only one interfacial layer is present and this interfacial layer 221b is between the cathode 224 and the organic layer 217. The interfacial layer 221b includes electron traps and host components of the interfacial layer 221b. In the second version of the interfacial layer 221b, the electron injection barrier ("$\Phi_{be}$") between the cathode 224 and the LUMO levels of the host components is large enough to prevent thermionic injection of electrons from the cathode 224 to the LUMO levels of the host components when the typical operating voltage is applied. For example, the $\Phi_{be}$ between the cathode 224 and the LUMO level of the host components is greater than 0.3 eV, preferably, greater than 0.5 eV. However, the $\Phi_{be}$ between the cathode 224 and the LUMO levels of the traps is small enough that upon application of the typical operating voltage, electrons can easily thermonically inject from the cathode 224 directly to the LUMO levels of the electron traps. For example, the $\Phi_{be}$ between the cathode 224 and the LUMO level of the traps is less than 0.3 eV, preferably, less than 0.1 eV.

Figure 3:
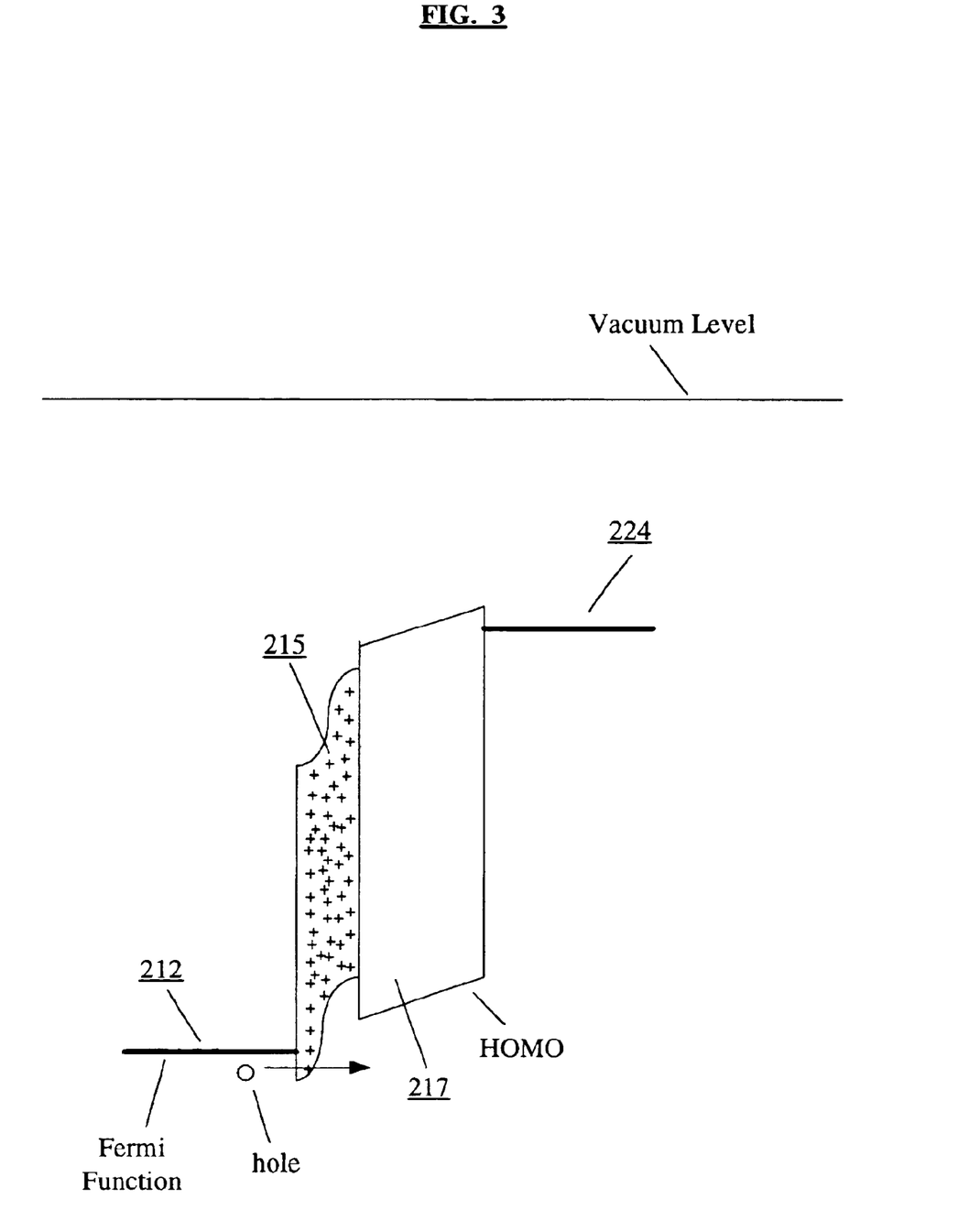
FIG. 3 shows the bending of the bands of the first configuration of the embodiment of the electronic device according to the present invention.

FIG. 3 shows the bending of the bands of the first configuration of the embodiment of the electronic device according to the present invention. As the voltage applied between the electrodes increases, a greater number of hole traps in the interfacial layer 215 is filled and this can be the result of injection as shown in FIG. 2a where holes are injected into the HOMO levels of the host components followed by trapping of the holes at the hole trap sites, or as shown in FIG. 2b where holes are directly injected into the hole trap sites. In FIG. 3, the trapped holes are specified by the symbol "+". As the number of trapped holes accumulated in the interfacial layer 215 increases, the electric field across the interfacial layer 215 also increases. Increasing the electric field increases the bending of the bands of the interfacial layer 215. Bending the bands of the interfacial layer facilitates the injection of holes from the anode 212 to the organic layer 217 by tunneling through the interfacial layer 215. In the configuration shown in FIG. 3, there's non-uniform distribution of the holes traps in the interfacial layer 215 resulting in non-uniform distribution of the holes and thus a non-uniform electric field across the interfacial layer 215. The non-uniform electric field across the interfacial layer 215 results in the non-uniform bending of the energy bands of the interfacial layer 215. Here, a fewer number of hole traps are near the interface between the interfacial/organic layers and thus there's less band bending near this interface. Alternatively, in another configuration (not shown), the hole traps can be uniformly distributed within the interfacial layer 215 resulting in the uniform distribution of holes within this layer and this produces a uniform electric field across the interfacial layer 215 resulting in uniform bending of the bands of the interfacial layer 215.

As the accumulation of trapped holes increases, the electric field across the interfacial layer 215 also increases resulting in increased bending of the bands of the interfacial layer 215 and this reduces the energy barrier for injection of holes into the organic layer 217. As the bending of the bands increases, the slope of the bands of the interfacial layer 215 also increases resulting in narrower and deeper edges thus making it easier for holes to tunnel through to the organic layer 217. Once the Fermi level of the anode 212 is at or below the HOMO level of the organic layer 217, some of the holes in the anode 212 can tunnel through the interfacial layer 215 to the organic layer 217 (i.e., the holes from the filled states of the anode 212 tunnel through the interfacial layer 215 to empty hole states in the organic layer 217).

The addition of the interfacial layer 215 with the hole traps provides several benefits. The accumulation of trapped holes in the interfacial layer 215 allows holes from the anode 212 to eventually tunnel through the interfacial layer 215 to the organic layer 217 thus increasing the number of holes injected into the organic layer 217. Also, with the interfacial layer 215a shown in FIG. 2a, because that interfacial layer provides a step in energy level, there may also be a greater number of holes that are thermionically injected into the organic layer. By increasing the number of holes injected into the organic layer 217, the efficiency of the electronic device can be increased. A large energy barrier between the anode 212 and the organic layer 217 would prevent holes from being injected into the organic layer 217 if these two layers were adjacent to each other and thus that organic layer would be unusable with that anode, but by adding the interfacial layer 215a or 215b with the traps, that organic layer may be used with that anode since the interfacial layers allow holes to tunnel through to the organic layer 217. In addition, employing interfacial layers allow optimal charge injection into different emissive layers where the same electrodes are used within the color display. For example, within the color display, interfacial layers of different thickness can be used with different emissive layers emitting different colors in order to optimize charge injection into the particular emissive layer where the same electrodes are used. Also, interfacial layers can be used with only some of the emissive layers while no interfacial layers are used with the other emissive layers.

Figure 4:
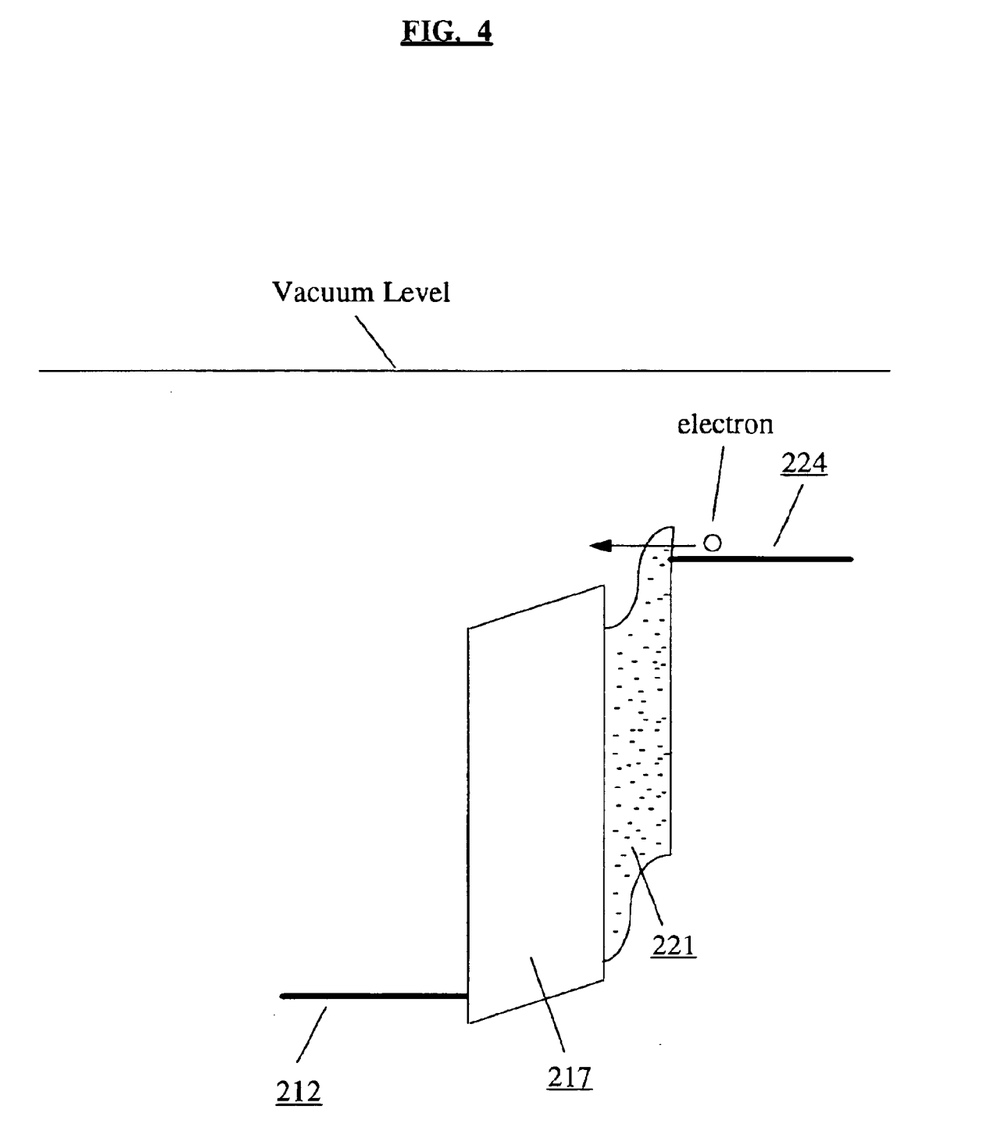
FIG. 4 shows the bending of the bands of the second configuration of the embodiment of the electronic device according to the present invention.

FIG. 4 shows the bending of the bands of the second configuration of the embodiment of the electronic device according to the present invention. In this configuration, only one interfacial layer is present and this interfacial layer is between a cathode 224 and an organic layer 217. The interfacial layer 221 includes electron traps and host components of the interfacial layer 221. As the voltage applied between the electrodes increases, a greater number of electron traps in the interfacial layer 221 is filled and this can be the result of injection as shown in FIG. 2c where electrons are injected into the LUMO levels of the host components followed by trapping of the electrons at the electron trap sites, or as shown in FIG. 2d where electrons are directly injected into the electron trap sites. In FIG. 4, the trapped electrons are specified by the symbol "−". As the number of trapped electrons accumulated in the interfacial layer 221 increases, the electric field across the interfacial layer 221 also increases. As the electric field increases the bending of the bands of the interfacial layer 221 increases. Bending the bands of the interfacial 221 layer lowers the energy barrier for injection of electrons into the organic layer 217. Bending the bands of the interfacial layer 221 facilitates the injection of electrons from the cathode 224 to the organic layer 217 by tunneling through the interfacial layer 221. In the configuration shown in FIG. 4, there's non-uniform distribution of the electron traps in the interfacial layer 221 resulting in non-uniform distribution of the electrons and thus a non-uniform electric field across the interfacial layer 221. The non-uniform electric field across the interfacial layer 221 results in the non-uniform bending of the bands of the interfacial layer 221. Here, a fewer number of electron traps are near the interface between the interfacial and organic layers and thus there's less band bending near this interface. Alternatively, in another configuration (not shown), the electron traps can be uniformly distributed within the interfacial layer 221 resulting in the uniform distribution of electrons within this layer and this produces a uniform electric field across the interfacial layer 221 resulting in uniform bending of the bands of the interfacial layer 221.

The accumulation of electrons leads to electric field changes across the interfacial layer and this leads to bending of the bands of the interfacial layer so that the energy barrier for injection of electrons into the organic layer 217 is reduced. Once the Fermi level of the cathode 224 is at or above the LUMO level of the organic layer 217, some of the electrons can tunnel from the cathode 224 through the interfacial layer 221 to the organic layer 217 (i.e., the electrons from the filled states of the cathode 224 pass through the interfacial layer 221 to empty electron states in the organic layer 217).

By adding the interfacial layer 221 that includes the electron traps, the bands of the interfacial layer 221 can be bent so that electrons can tunnel through the interfacial layer 221 to the organic layer 217 thus increasing the number of electrons injected into the organic layer 217. Also, with the interfacial layer 221a shown in FIG. 2c, because that interfacial layer provides a step in energy level, there may also be a greater number of electrons that are thermionically injected into the organic layer 217. By increasing the number of electrons injected into the organic layer 217, the efficiency of the electronic device can be increased. A large energy barrier between the electrode 224 and the organic layer 217 would prevent electrons from being injected into the organic layer 217 if these two layers were adjacent to each other and thus that organic layer 217 would be unusable, but by adding the interfacial layer 221, that organic layer 217 may be used within the electronic device since the interfacial layer 221 allows electrons to tunnel through to the organic layer 217. In addition, employing interfacial layers allow optimal charge injection into different emissive layers where the same electrodes are used within the color display.

Figure 5:
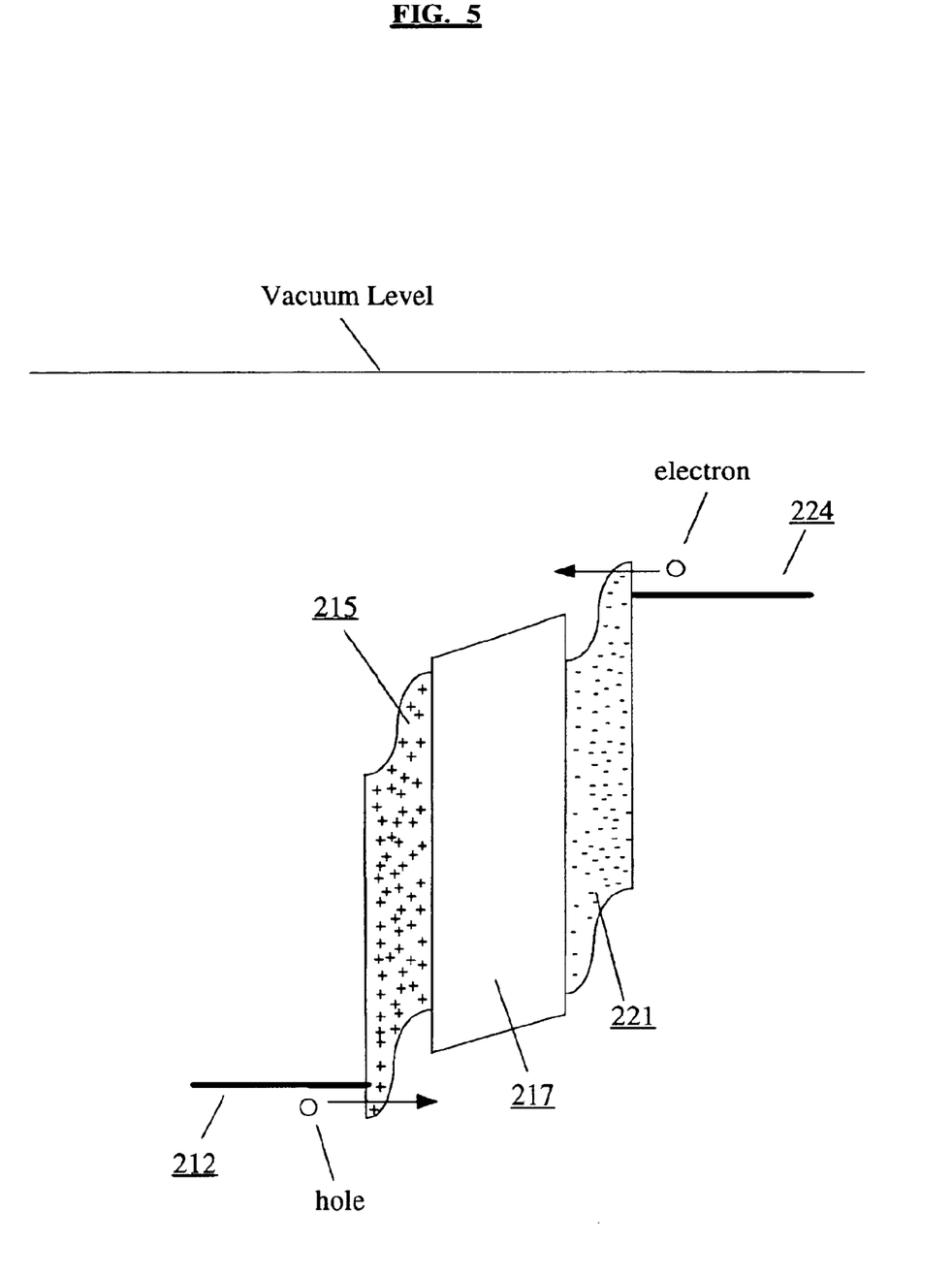
FIG. 5 shows the bending of the bands of the third configuration of the embodiment of the electronic device according to the present invention.

FIG. 5 shows the bending of the bands of the third configuration of the embodiment of the electronic device according to the present invention. In this configuration, two interfacial layers are employed—the interfacial layer 215 is between the anode 212 and the organic layer 217 and the interfacial layer 221 is between the cathode 224 and the organic layer 217. Here, the interfacial layer 215 includes host components and hole traps that are non-uniformly distributed, and the interfacial layer 221 includes host components and electron traps that are non-uniformly distributed. This configuration can be used when it is difficult to inject both the electrons and holes from the cathode and anode being used in the device.

The holes injected from the anode 212 to the interfacial layer 215 are trapped by the hole traps and the accumulation of the trapped holes leads to electric field changes across the interfacial layer 215 and this leads to bending of the bands of the interfacial layer 215 so that the energy barrier for injection of holes into the organic layer 217 is reduced. Once the Fermi level of the anode 212 is at or below the HOMO level of the organic layer 217, the holes from the filled states of the anode 212 pass through the interfacial layer 215 to empty hole states in the organic layer 217.

Similarly, the electrons injected from the cathode 224 to the interfacial layer 221 are trapped by the electron traps and the accumulation of the trapped electrons leads to electric field changes across the interfacial layer 221 and this leads to bending of the bands of the interfacial layer 221 so that the energy barrier for injection of electrons into the organic layer 217 is reduced. Once the Fermi level of the cathode 224 is at or above the LUMO level of the organic layer 217, the electrons from the filled states of the cathode 224 pass through the interfacial layer 221 to empty electron states in the organic layer 217.

By employing both of the interfacial layers 215, 221, the number of holes injected into the organic layer 217 is increased and the number of electrons injected into the organic layer 217 is also increased thus improving the efficiency of the device and also allowing that organic layer 217 with the large energy barriers to be employed within the electronic device.

As any person of ordinary skill in the art of electronic device fabrication will recognize from the description, figures, and examples that modifications and changes can be made to the embodiments of the invention without departing from the scope of the invention defined by the following claims.

What is claimed:

1. An electronic device, comprising:
   a substrate;
   an anode on said substrate;
   an organic layer on said anode;
   a cathode on said organic layer; and
   at least one of: (1) a first interfacial layer between said anode and said organic layer and (2) a second interfacial layer between said organic layer and said cathode, wherein said first interfacial layer includes a plurality of hole traps to accumulate a portion of a plurality of holes so that at least some of said plurality of holes can tunnel from said anode through said first interfacial layer to said organic layer, and
   said second interfacial layer includes a plurality of electron traps to accumulate a portion of a plurality of electrons so that at least some of said plurality of electrons can tunnel from said cathode through said second interfacial layer to said organic layer.

2. The electronic device of claim 1 wherein
   an increase in accumulation of said portion of said plurality of holes increases an electric field across said first interfacial layer that increases bending of bands of said first interfacial layer which increases said at least some of said plurality of holes that can tunnel from said anode to said organic layer, and
   an increase in accumulation of said portion of said plurality of electrons increases an electric field across said second interfacial layer that increases bending of bands of said second interfacial layer which increases said at least some of said plurality of electrons that can tunnel from said cathode to said organic layer.

3. The electronic device of claim 2 wherein
   said bands of said first interfacial layer are uniformly bent, and
   said bands of said second interfacial layer are uniformly bent.

4. The electronic device of claim 2 wherein
   said bands of said first interfacial layer are non-uniformly bent, and
   said bands of said second interfacial layer are non-uniformly bent.

5. The electronic device of claim 1 wherein
   an energy barrier to trap holes between HOMO levels of said plurality of hole traps and HOMO levels of a plurality of host components of said first interfacial layer is large enough so that accumulation of said portion of said plurality of holes causes bands of said first interfacial layer to bend, and
   an energy barrier to trap electrons between LUMO levels of said plurality of electron traps and LUMO levels of a plurality of host components of said second interfacial layer is large enough so that accumulation of said portion of said plurality of electrons causes bands of said second interfacial layer to bend.

6. The electronic device of claim 1 wherein
   said at least some of said plurality of holes tunnel from said anode to said organic layer when a Fermi level of said anode is at or below a HOMO level of said organic layer, and
   said at least some of said plurality of electrons tunnel from said cathode to said organic layer when a Fermi level of said cathode is at or above a LUMO level of said organic layer.

7. The electronic device of claim 1 wherein
   a density of said plurality of hole traps is greater than $10^{14}/cm^2$, and
   a density of said plurality of electron traps is greater than $10^{14}/cm^2$.

8. The electronic device of claim 1 wherein
   a hole injection barrier between said anode and HOMO levels of a plurality of host components of said first interfacial layer is small enough that when a typical operating voltage is applied, said portion of said plurality of holes can thermonically inject from said anode to said HOMO levels.

9. The electronic device of claim 1 wherein
a hole injection barrier between said anode and HOMO levels of a plurality of host components of said first interfacial layer is large enough that when a typical operating voltage is applied, said portion of said plurality of holes cannot thermonically inject from said anode to said HOMO levels of said plurality of host components; and
a hole injection barrier between said anode and HOMO levels of a plurality of hole traps is small enough that when said typical operating voltage is applied, said portion of said plurality of holes can thermonically inject from said anode directly to said HOMO levels of said plurality of hole traps.

10. The electronic device of claim 1 wherein
an electron injection barrier between said cathode and LUMO levels of a plurality of host components of said second interfacial layer is small enough that when a typical operating voltage is applied, said portion of said plurality of electrons can thermonically inject from said cathode to said LUMO levels.

11. The electronic device of claim 1 wherein
an electron injection barrier between said cathode and LUMO levels of a plurality of host components of said second interfacial layer is large enough that when a typical operating voltage is applied, said portion of said plurality of electrons cannot thermonically inject from said cathode to said LUMO levels of said plurality of host components; and
an electron injection barrier between said cathode and LUMO levels of a plurality of electron traps is small enough that when said typical operating voltage is applied, said portion of said plurality of electrons can thermonically inject from said cathode directly to said LUMO levels of said plurality of electron traps.

12. The electronic device of claim 1 wherein said electronic device is any one of: an OLED pixel, an OLED light source element, or a phototransistor.

13. An electronic device, comprising:
a substrate;
a cathode on said substrate;
an organic layer on said cathode;
an anode on said organic layer; and
at least one of: (1) a first interfacial layer between said cathode and said organic layer and (2) a second interfacial layer between said organic layer and said anode,
wherein said first interfacial layer includes a plurality of electron traps to accumulate a portion of a plurality of electrons so that at least some of said plurality of electrons can tunnel from said cathode through said first interfacial layer to said organic layer, and
said second interfacial layer includes a plurality of hole traps to accumulate a portion of a plurality of holes so that at least some of said plurality of holes can tunnel from said anode through said second interfacial layer to said organic layer.

14. The electronic device of claim 13 wherein
an increase in accumulation of said portion of said plurality of electrons increases an electric field across said first interfacial layer that increases bending of bands of said first interfacial layer which increases said at least some of said plurality of electrons that can tunnel from said cathode to said organic layer, and
an increase in accumulation of said portion of said plurality of holes increases an electric field across said second interfacial layer that increases bending of bands of said second interfacial layer which increases said at least some of said plurality of holes that can tunnel from said anode to said organic layer.

15. The electronic device of claim 13 wherein
an energy barrier to trap electrons between a LUMO level of said plurality of electron traps and a LUMO level of another component of said first interfacial layer is large enough so that accumulation of said portion of said plurality of electrons causes bands of said first interfacial layer to bend, and
an energy barrier to trap holes between a HOMO level of said plurality of hole traps and a HOMO level of another component of said second interfacial layer is large enough so that accumulation of said portion of said plurality of holes causes bands of said second interfacial layer to bend.

16. The electronic device of claim 13 wherein
said at least some of said plurality of holes tunnel from said anode to said organic layer when a Fermi level of said anode is at or below a HOMO level of said organic layer, and
said at least some of said plurality of electrons tunnel from said cathode to said organic layer when a Fermi level of said cathode is at or above a LUMO level of said organic layer.

17. The electronic device of claim 13 wherein
a hole injection barrier between said anode and HOMO levels of a plurality of host components of said second interfacial layer is small enough that when a typical operating voltage is applied, said portion of said plurality of holes can thermonically inject from said anode to said HOMO levels.

18. The electronic device of claim 13 wherein
a hole injection barrier between said anode and HOMO levels of a plurality of host components of said second interfacial layer is large enough that when a typical operating voltage is applied, said portion of said plurality of holes cannot thermonically inject from said anode to said HOMO levels of said plurality of host components; and
a hole injection barrier between said anode and HOMO levels of a plurality of hole traps is small enough that when said typical operating voltage is applied, said portion of said plurality of holes can thermonically inject from said anode directly to said HOMO levels of said plurality of hole traps.

19. The electronic device of claim 13 wherein
an electron injection barrier between said cathode and LUMO levels of a plurality of host components of said first interfacial layer is small enough that when a typical operating voltage is applied, said portion of said plurality of electrons can thermonically inject from said cathode to said LUMO levels.

20. The electronic device of claim 13 wherein
an electron injection barrier between said cathode and LUMO levels of a plurality of host components of said first interfacial layer is large enough that when a typical operating voltage is applied, said portion of said plurality of electrons cannot thermonically inject from said cathode to said LUMO levels of said plurality of host components; and
an electron injection barrier between said cathode and LUMO levels of a plurality of electron traps is small enough that when said typical operating voltage is applied, said portion of said plurality of electrons can thermonically inject from said cathode directly to said LUMO levels of said plurality of electron traps.

* * * * *